United States Patent
Yeom

(10) Patent No.: US 9,024,426 B2
(45) Date of Patent: May 5, 2015

(54) SEMICONDUCTOR DEVICE AND METHOD OF MANUFACTURING THE SAME

(71) Applicant: Kundae Yeom, Cheonan-si (KR)

(72) Inventor: Kundae Yeom, Cheonan-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/048,494

(22) Filed: Oct. 8, 2013

(65) Prior Publication Data

US 2014/0103516 A1    Apr. 17, 2014

(30) Foreign Application Priority Data

Oct. 15, 2012  (KR) .................. 10-2012-0114303

(51) Int. Cl.
| | |
|---|---|
| H01L 23/02 | (2006.01) |
| H01L 23/34 | (2006.01) |
| H01L 21/44 | (2006.01) |
| H01L 23/50 | (2006.01) |
| H01L 23/48 | (2006.01) |
| H01L 23/498 | (2006.01) |

(52) U.S. Cl.
CPC ....... *H01L 23/50* (2013.01); *H01L 2224/13025* (2013.01); *H01L 2224/14181* (2013.01); *H01L 2224/16145* (2013.01); *H01L 2224/16225* (2013.01); *H01L 2224/32225* (2013.01); *H01L 2224/73253* (2013.01); *H01L 2225/1023* (2013.01); *H01L 2225/107* (2013.01); *H01L 2924/15311* (2013.01); *H01L 2924/15331* (2013.01); *H01L 2924/18161* (2013.01); *H01L 2225/06513* (2013.01); *H01L 2225/06541* (2013.01); *H01L 23/481* (2013.01); *H01L 23/49811* (2013.01); *H01L 23/49827* (2013.01)

(58) Field of Classification Search
CPC ............. H01L 2924/00; H01L 2924/15311; H01L 2224/32145; H01L 25/0657; H01L 23/3128; H01L 25/0652
USPC ............ 438/25–127; 257/678, 686, 687, 723, 257/724, 778
See application file for complete search history.

(56) References Cited

U.S. PATENT DOCUMENTS

| | | | |
|---|---|---|---|
| 6,400,019 | B1 | 6/2002 | Hirashima et al. |
| 6,434,017 | B1 | 8/2002 | Iwabuchi |
| 6,753,616 | B2 | 6/2004 | Coyle |
| 7,061,122 | B2 | 6/2006 | Kim et al. |
| 7,064,005 | B2 | 6/2006 | Takaoka |
| 7,242,082 | B2 | 7/2007 | Eide |

(Continued)

FOREIGN PATENT DOCUMENTS

| | | |
|---|---|---|
| JP | 2011-129717 | 6/2011 |
| KR | 1020030054066 A | 7/2003 |

*Primary Examiner* — Hsien Ming Lee
(74) *Attorney, Agent, or Firm* — Myers Bigel Sibley & Sajovec, P.A.

(57) ABSTRACT

Disclosed are semiconductor devices and methods of manufacturing the same. The semiconductor device includes an interposer and a first semiconductor package comprising a first substrate, and a first semiconductor chip mounted on the first substrate. The device also includes at least two second semiconductor packages electrically connected to a top surface of the interposer, the second semiconductor packages spaced apart from each other in a direction parallel to the top surface of the interposer. Each of the second semiconductor packages comprises a second substrate, a second semiconductor chip mounted on the second substrate and a mold part disposed on the second substrate to protect the second semiconductor chip.

18 Claims, 8 Drawing Sheets

(56) References Cited

U.S. PATENT DOCUMENTS

| | | |
|---|---|---|
| 7,714,426 B1 | 5/2010 | Gann et al. |
| 7,750,455 B2 * | 7/2010 | Pagaila et al. ............... 257/686 |
| 7,982,300 B2 | 7/2011 | Gann et al. |
| 7,990,727 B1 | 8/2011 | Mantz |
| 8,114,707 B2 | 2/2012 | Farooq et al. |
| 8,143,103 B2 * | 3/2012 | Kim et al. .................. 438/109 |
| 8,531,043 B2 * | 9/2013 | Ha et al. ..................... 257/787 |
| 2010/0187683 A1 | 7/2010 | Bakir et al. |
| 2011/0180916 A1 | 7/2011 | Han |
| 2012/0051019 A1 | 3/2012 | Park et al. |
| 2012/0248439 A1 * | 10/2012 | Lee ............................. 257/48 |

* cited by examiner

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2012-0114303, filed on Oct. 15, 2012, the entirety of which is incorporated by reference herein.

BACKGROUND

Embodiments of the inventive concept relate to a semiconductor device and a method of manufacturing the same and, more particularly, to a semiconductor device including stacked semiconductor packages and a method of manufacturing the same.

Semiconductor devices are widely used in various electronic industries because of their small size, multi-functionality and/or low manufacturing costs. Demand for highly integrated and high speed semiconductor devices has increased. However, problems have arisen in various processes that may make it difficult to realize the semiconductor devices.

SUMMARY

Embodiments of the inventive concept may provide highly integrated semiconductor devices.

Embodiments of the inventive concept may also provide methods of manufacturing the semiconductor device.

In an embodiment, a semiconductor device may include: an interposer; a first semiconductor package electrically connected to a bottom surface of the interposer comprising: a first substrate; and a first semiconductor chip mounted on the first substrate; and at least two second semiconductor packages electrically connected to a top surface of the interposer, the at least two second semiconductor packages spaced apart from each other in a direction parallel to the top surface of the interposer, wherein each of the second semiconductor packages comprises: a second substrate; a second semiconductor chip mounted on the second substrate; and a mold part disposed on the second substrate to protect the second semiconductor chip. In another embodiment, the first semiconductor package may also include a mold part disposed on the first substrate to protect the first semiconductor chip.

In an embodiment, a size of the interposer may be substantially equal to or greater than a size of the first semiconductor package.

In an embodiment, a size of each of the second semiconductor packages may be smaller than a size of the interposer and may be smaller than a size of the first semiconductor package.

In an embodiment, the semiconductor device may further include: first connecting patterns disposed on the first substrate and adjacent to the first semiconductor chip. The first connecting patterns may electrically connect the first substrate to the interposer.

In an embodiment, the semiconductor device may further include: second connecting patterns disposed between the second substrate and the interposer. The second connecting patterns may electrically connect the interposer to the second substrate.

In an embodiment, the first semiconductor chip may include a logic chip; and the second semiconductor chip may include a memory chip.

In another aspect, a semiconductor device may include: a lower package including a logic chip mounted on a package substrate, the lower package having a first size; at least two upper packages, each of the upper packages comprising a memory chip mounted on a substrate, and each of the upper packages having a second size smaller than the first size; and an interposer disposed between the lower package and the upper packages, the interposer electrically connecting the lower package to the upper packages, and the interposer having a third size equal to or greater than the first size, wherein the interposer further comprises pinouts arranged on a top surface of the interposer to connect the at least two upper packages of the second size and at least one upper package of a fourth size smaller than the first size.

In still another embodiment, a method of manufacturing a semiconductor device may include: mounting a first semiconductor chip on a substrate to form a first semiconductor package; testing electrical characteristics of the first semiconductor package; mounting second semiconductor chips on second substrates, respectively, to form second semiconductor packages; testing electrical characteristics of the second semiconductor packages; electrically connecting the first semiconductor package passing the test for the first semiconductor package to a bottom surface of an interposer; and electrically connecting the second semiconductor packages passing the test for the second semiconductor packages to a top surface of the interposer.

In an embodiment, the second semiconductor packages may be disposed to be spaced apart from each other in a direction parallel to the top surface of the interposer.

In an embodiment, a size of the interposer may be substantially equal to or greater than a size of the first semiconductor package.

In an embodiment, the first semiconductor chip may include a logic chip; and the second semiconductor chip may include a memory chip.

A semiconductor device comprising: an interposer; a first semiconductor chip mounted on a first substrate with a first connecting pattern, wherein the first semiconductor chip is electrically connected to a bottom surface of the interposer through a second connecting pattern disposed on the first substrate and adjacent to the first semiconductor chip; a first mold part covering the first substrate and the first connecting pattern, wherein the first mold part surrounds the first semiconductor chip and the second connecting pattern, exposing a top surface of the first semiconductor chip; and at least two semiconductor packages directly connected to a top surface of the interposer with third connecting patterns, wherein each of the at least two semiconductor packages comprises a second semiconductor chip protected by a second mold part, and wherein the at least two semiconductor packages are laterally adjacent to each other along the interposer.

In an embodiment, the first mold part comprises an exposed-mold underfill structure.

In an embodiment, wherein the second mold parts cover the second semiconductor chips.

In an embodiment, wherein the second mold parts comprise exposed-mold underfill structures.

In an embodiment, wherein the second semiconductor chips are mounted on second substrates that are directly connected to the third connecting patterns and covered by the second mold parts.

In an embodiment, wherein the second semiconductor packages comprise through-electrodes covered by the second mold parts.

In an embodiment, wherein the second and third connecting patterns comprise solder balls.

In an embodiment, the top surface of the interposer comprises pinouts arranged such that the at least two semiconductor packages may vary in size.

BRIEF DESCRIPTION OF THE DRAWINGS

Embodiments of the inventive concept will become more apparent in view of the attached drawings and accompanying detailed description.

DETAILED DESCRIPTION OF THE EMBODIMENTS

Figure 1A:
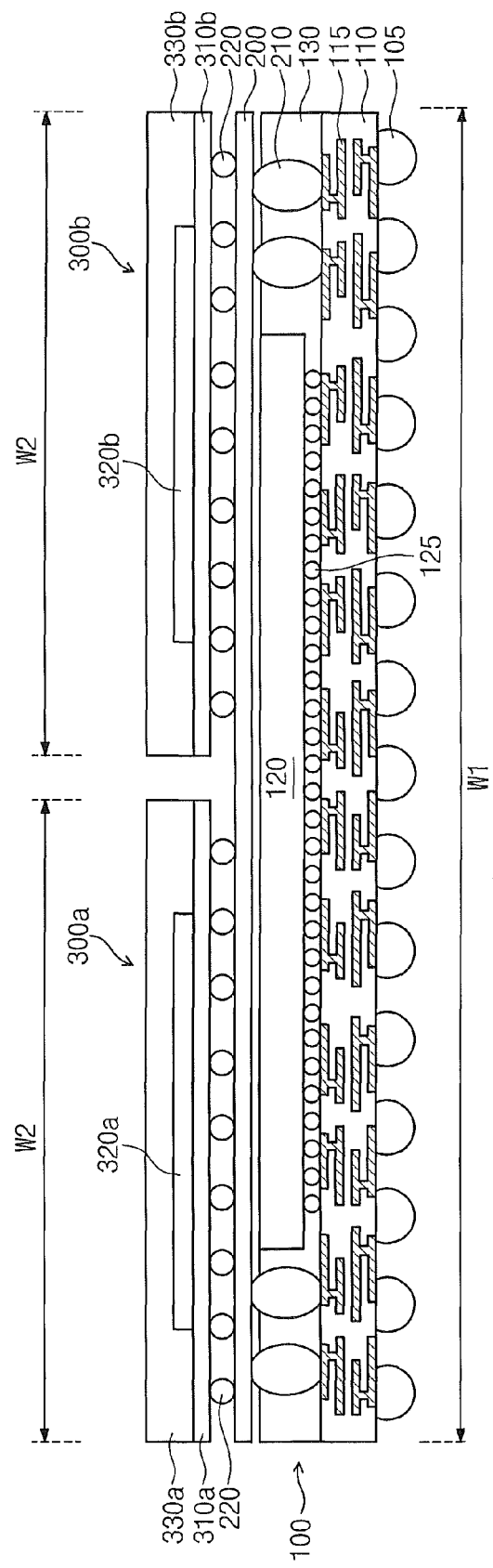
FIG. 1A is a cross-sectional view illustrating a semiconductor device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, a structure illustrated as a rectangle will, typically, have rounded or curved features. Thus, the regions illustrated in the figures are schematic in nature and their shapes are not intended to illustrate the actual shape of the structure and are not intended to limit the scope of example embodiments.

Figure 1B:
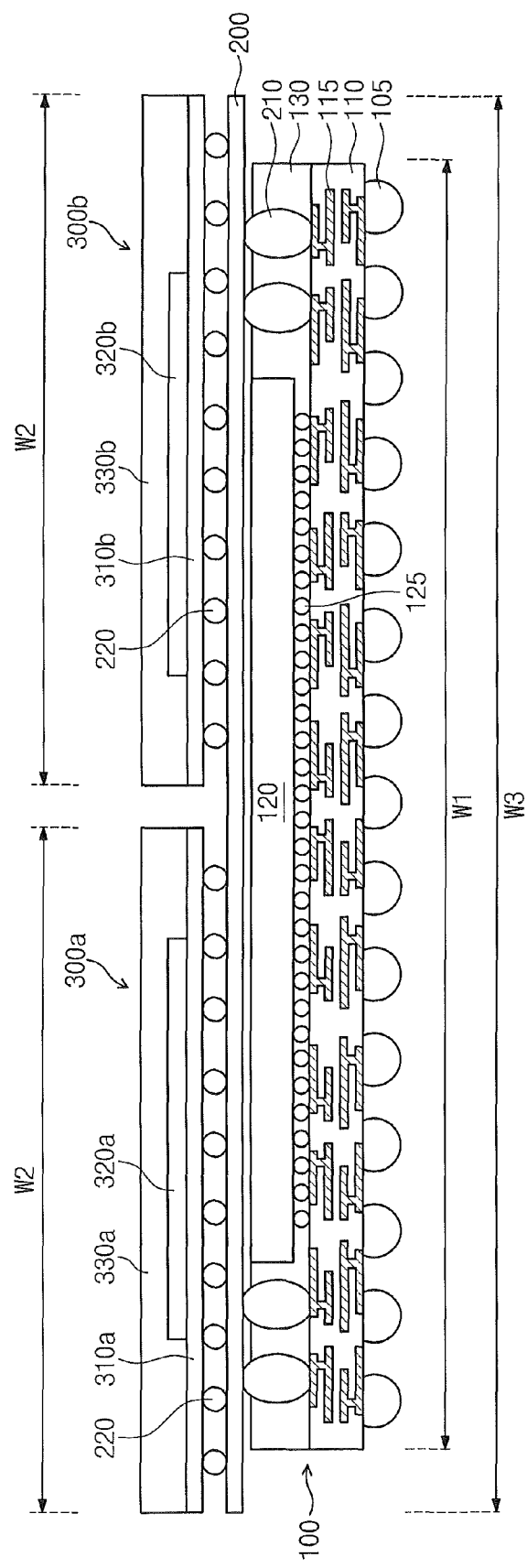
FIG. 1B is a cross-sectional view illustrating a semiconductor device according to other embodiments of the inventive concept.
Figure 1C:
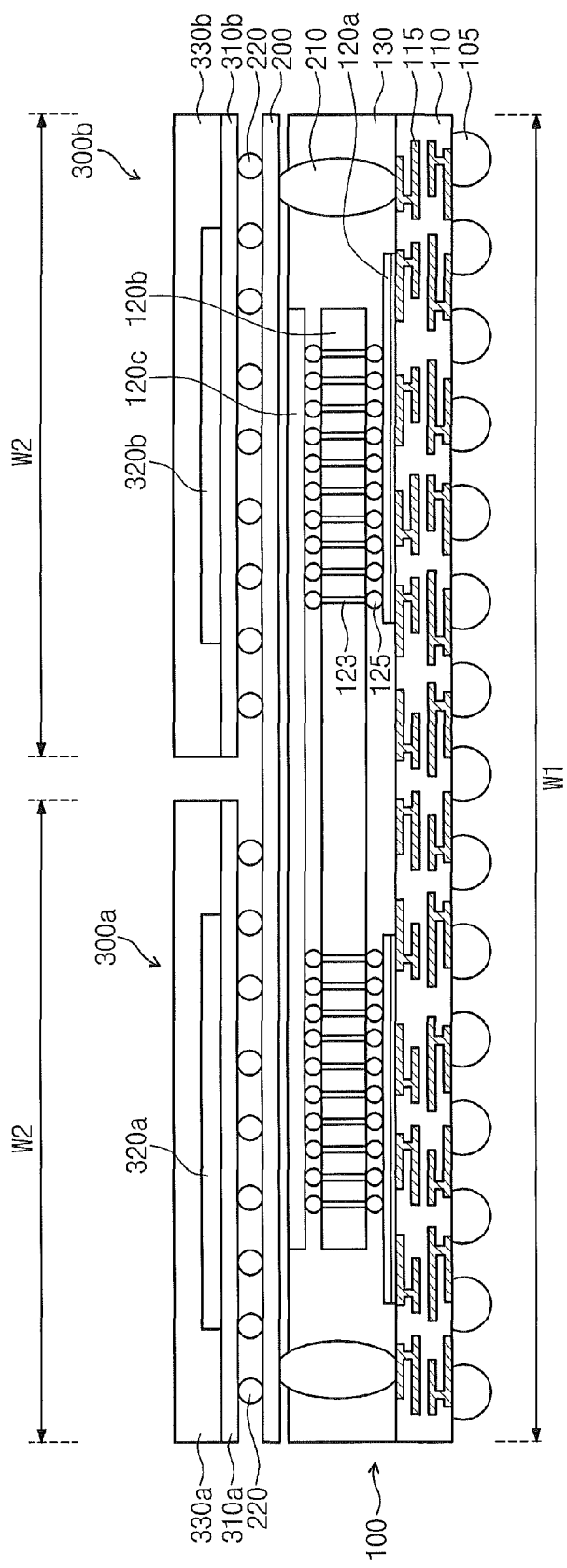
FIG. 1C is a cross-sectional view illustrating a semiconductor device according to still other embodiments of the inventive concept.

FIG. 1A is a cross-sectional view illustrating a semiconductor device according to some embodiments of the inventive concept, FIG. 1B is a cross-sectional view illustrating a semiconductor device according to other embodiments of the inventive concept, and FIG. 1C is a cross-sectional view illustrating a semiconductor device according to still other embodiments of the inventive concept.

Referring to FIGS. 1A, 1B, and 1C, a semiconductor device may include a first semiconductor package 100, at least two second semiconductor package 300*a* and 300*b*, and an interposer 200 disposed between the first semiconductor package 100 and the second semiconductor packages 300*a* and 300*b*.

The first semiconductor package 100 may include a first substrate 110, a first semiconductor chip 120 mounted on the first substrate 110, and a first mold part 130 disposed on the first substrate 110 to protect the first semiconductor chip 120.

The first substrate 110 may be a printed circuit board (PCB). The first substrate 110 may include a plurality of circuits 115. The first substrate 110 may include a bottom surface on which external terminals 105 (e.g., solder balls) are disposed, and a top surface on which the first semiconductor chip 120 is mounted. A plurality of chip connecting patterns 125 may be disposed on the top surface of the first substrate 110. The plurality of chip connecting patterns 125 may electrically connect the first semiconductor chip 120 to the first substrate 110. For example, the chip connecting patterns 125 may be solder balls.

The first semiconductor chip 120 may be mounted on the top surface of the first substrate 110. The term "mounted" means that a semiconductor element is bonded to a substrate, a holder, or a frame for actual use thereof. In an embodiment, the first semiconductor chip 120 may be bonded to the first substrate 110 through the chip connecting pads 125. The first semiconductor chip 120 may be disposed on a center portion of the first substrate 110.

According to embodiments illustrated in FIGS. 1A and 1B, the first semiconductor chip 120 may include a logic chip. A size of the logic chip may be greater than a size of a memory chip.

The first mold part 130 may be disposed on the first substrate 110 to protect the first semiconductor chip 120 and the chip connecting patterns 125. In an embodiment, the first mold part 130 may have an exposed-mold underfill (e-MUF) structure which exposes a top surface of the first semiconductor chip 120 and covers the first semiconductor chip 120 and the chip connecting patterns 125. The first mold part 130 having the e-MUF structure may be a united structure of a general underfill covering chip connecting patterns and a mold covering a semiconductor chip. Thus, the first mold part 130 may include a first portion covering the chip connecting patterns 125 and a second portion covering the first semiconductor chip 120, and the first and second portions of the first mold part 130 may be continuously connected to each other without an interface therebetween. Additionally, due to the first mold part 130 having the e-MUF structure, an underfill process may be omitted in a method of manufacturing the first semiconductor package 100. Thus, the manufacturing method of the first semiconductor package 100 may be simplified.

In another embodiment, the first mold part 130 may include an underfill covering the chip connecting patterns 125 and a mold covering the first semiconductor chip 120. Additionally, the mold may completely cover the top surface of the first semiconductor chip 120. However, the inventive concept is not limited to the structure of the first mold part 130.

Each of the second semiconductor packages 300a and 300b may include a second substrate 310a or 310b, a second semiconductor chip 320a or 320b, and a second mold part 330a or 330b.

The second substrates 310a and 310b may be printed circuit boards. The second semiconductor chips 320a and 320b may be mounted on the second substrates 310a and 310b, respectively. In an embodiment, the second semiconductor chips 320a and 320b may be adhered to the second substrates 310a and 310b by adhesive films, respectively. The second semiconductor chips 320a and 320b may be memory chips. As described above, the memory chip may be smaller in size than the logic chip. Thus, the at least two second semiconductor package 300a and 300b including the memory chips of the relatively small sizes may be disposed to correspond to the first semiconductor chip 100 including the logic chip of the relatively large size. This will be described in more detail later.

The second mold parts 330a and 330b may be disposed on the second substrates 310a and 310b to protect the second semiconductor chips 320a and 320b, respectively. In an embodiment, the second mold parts 330a and 330b may completely cover top surfaces of the second semiconductor chips 320a and 320b, respectively. In another embodiment, each of the second mold parts 330a and 330b may have an e-MUF structure. However, the inventive concept is not limited thereto. The structures of the second mold parts 330a and 330b may be variously modified.

In other embodiments, the second substrate 310a or 310b may be omitted in each of the second semiconductor packages 300a and 300b. In this case, the second semiconductor chip 320a or 320b of each of the second semiconductor packages 300a and 300b may include through-electrodes and may be covered by the second mold part 330a or 330b.

The interposer 200 may electrically connect the first and second semiconductor packages 100, 300a, and 300b to each other.

A bottom surface of the interposer 200 may face the first semiconductor chip 120 of the first semiconductor package 100. The interposer 200 and the first semiconductor package 100 may be electrically connected to each other through first connecting patterns 210. The first connecting patterns 210 may electrically connect the bottom surface of the interposer 200 to the first substrate 110 of the first semiconductor package 100. For example, each of the first connecting patterns 210 may include a conductive pattern formed of a metal such as a solder ball or copper.

Each of the second semiconductor packages 300a and 300b may include a single second semiconductor chip 320a or 320b. If the second semiconductor chips 320a and 320b are the memory chips, two memory chips which are vertically stacked may be generally mounted on a semiconductor package. However, in this case, an electrical error may occur between the stacked memory chips. According to embodiments of the inventive concept, each of the second semiconductor packages 300a and 300b includes the single second semiconductor package 320a or 320b, such that the electrical error may be prevented. Additionally, the second semiconductor packages 300a and 300b are disposed to be laterally spaced apart from each other over the first semiconductor package 100 by the advantage that the memory chip is smaller in size than the logic chip, such that the number of the memory chips may not be reduced.

Pinouts may be formed on the top surface of the interposer 200. The second semiconductor packages 300a and 330b may be electrically connected to the pinouts through second connecting patterns 220. According to embodiments of the inventive concept, since each of the second semiconductor packages 300a and 300b includes the memory chip, the pinouts may be regularly arranged on the top surface of the interposer 200 regardless of the first semiconductor package 100. Additionally, the interposer 200 may be provided to have the pinouts suitable to difference between the memory chips, such that a manufacturing method of the semiconductor device may be simplified.

In the embodiments illustrated in FIGS. 1A and 1C, a size of the interposer 200 may be substantially equal to a size of the first semiconductor package 100. For example, a width W1 of the interposer 200 may be substantially equal to a width W1 of the first semiconductor package 100 in a cross-sectional view.

The at least two second semiconductor packages 300a and the 300b may be spaced apart from each other on the top surface of the interposer 200 in a direction parallel to the top surface of the interposer 200. The interposer 200 may be electrically connected to the second semiconductor packages 300a and 300b through the second connecting patterns 220. The second connecting patterns 220 may electrically connect the second substrates 310a and 310b of the second semiconductor packages 300a and 300b to the top surface of the interposer 200. For example, the second connecting patterns 220 may include solder balls.

According to embodiments of the inventive concept, each of the second semiconductor packages 300a and 300b may be smaller in size than the interposer 200. A width W2 of each of the second semiconductor packages 300a and 300b may be smaller than the width W1 of the interposer 200 in a cross-sectional view.

Since the interposer 200 is disposed between the first semiconductor package 100 and the second semiconductor packages 300a and 300b, a warpage phenomenon of the semiconductor device including the interposer 200 may be reduced or prevented.

According to the embodiment illustrated in FIG. 1B, a size of the interposer 200 may be greater than the size of the first semiconductor package 100. For example, a width W3 of the interposer 200 may be greater than the width W1 of the first semiconductor package 100 in a cross-sectional view. As a result, since the interposer 200 is used in the semiconductor device, it is possible to increase the degree of freedom of the number and/or the size of the second semiconductor packages 300a and 300b.

According to the embodiment illustrated in FIG. 1C, a semiconductor package 100 may include a plurality of first semiconductor packages 120a, 120b, and 120c. The first semiconductor packages 120a, 120b, and 120c may include memory chips as well as the logic chip. At least one of the first semiconductor chips 120a, 120b, and 120c may include a through-silicon-via (TSV) 123.

Figure 2:
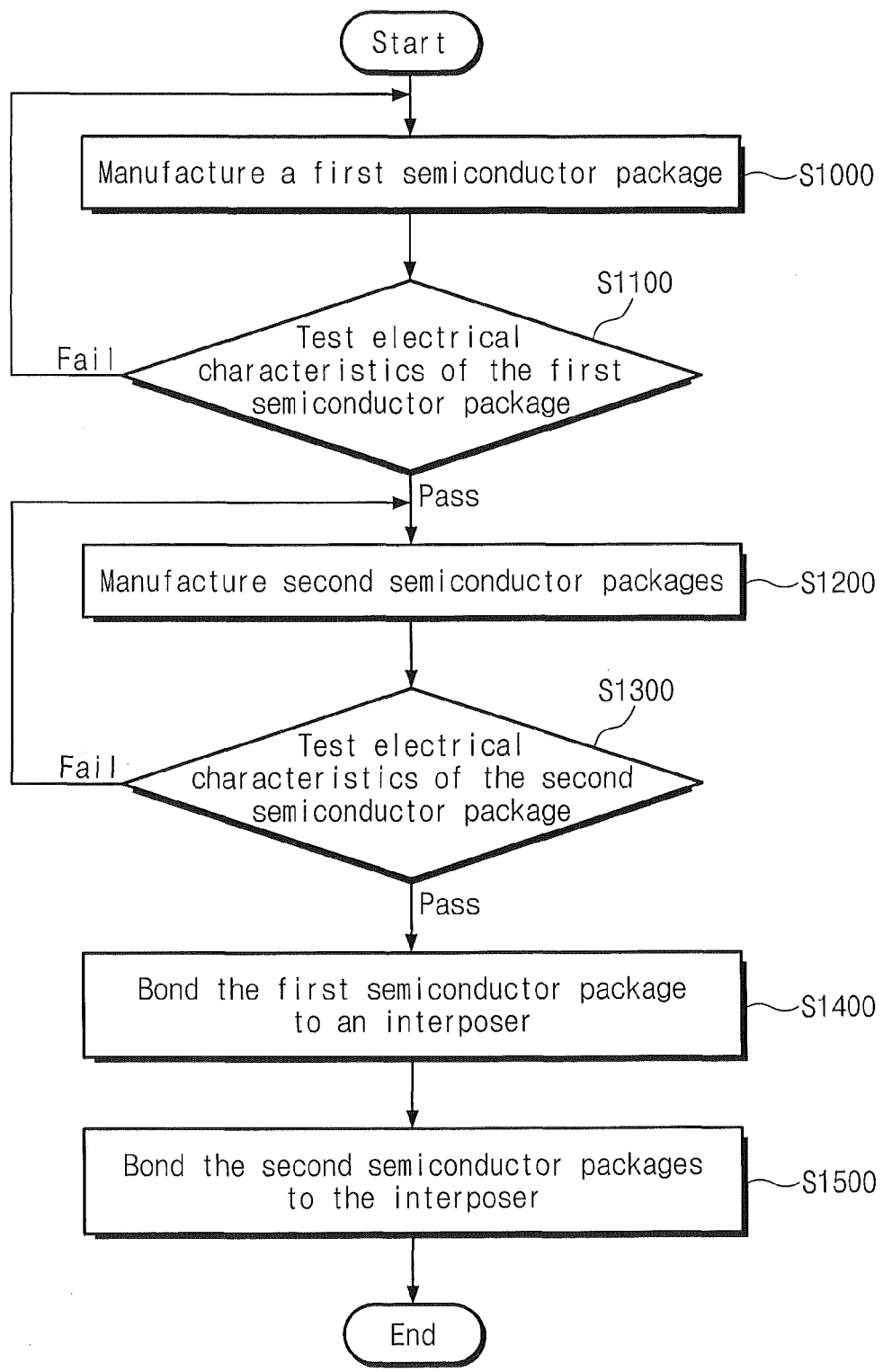
FIG. 2 is a flowchart illustrating a method of manufacturing a semiconductor device according to some embodiments of the inventive concept.
Figure 3A:
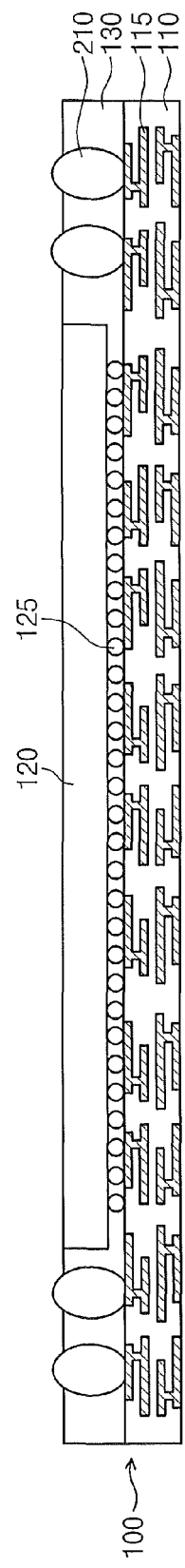
FIGS. 3A through 3C are cross-sectional views illustrating a method of manufacturing a semiconductor device according to some embodiments of the inventive concept.
Figure 3B:
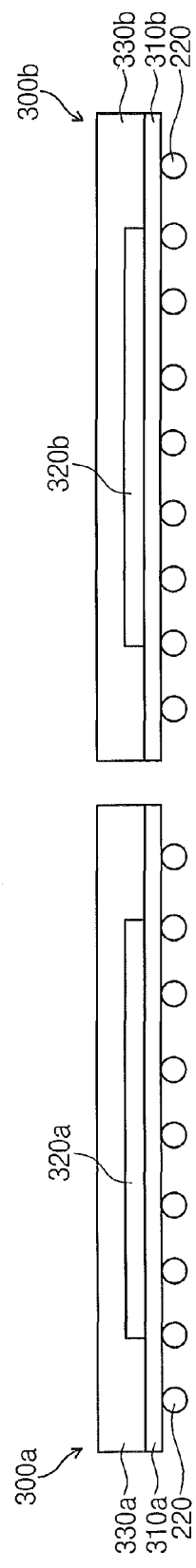
Figure 3C:
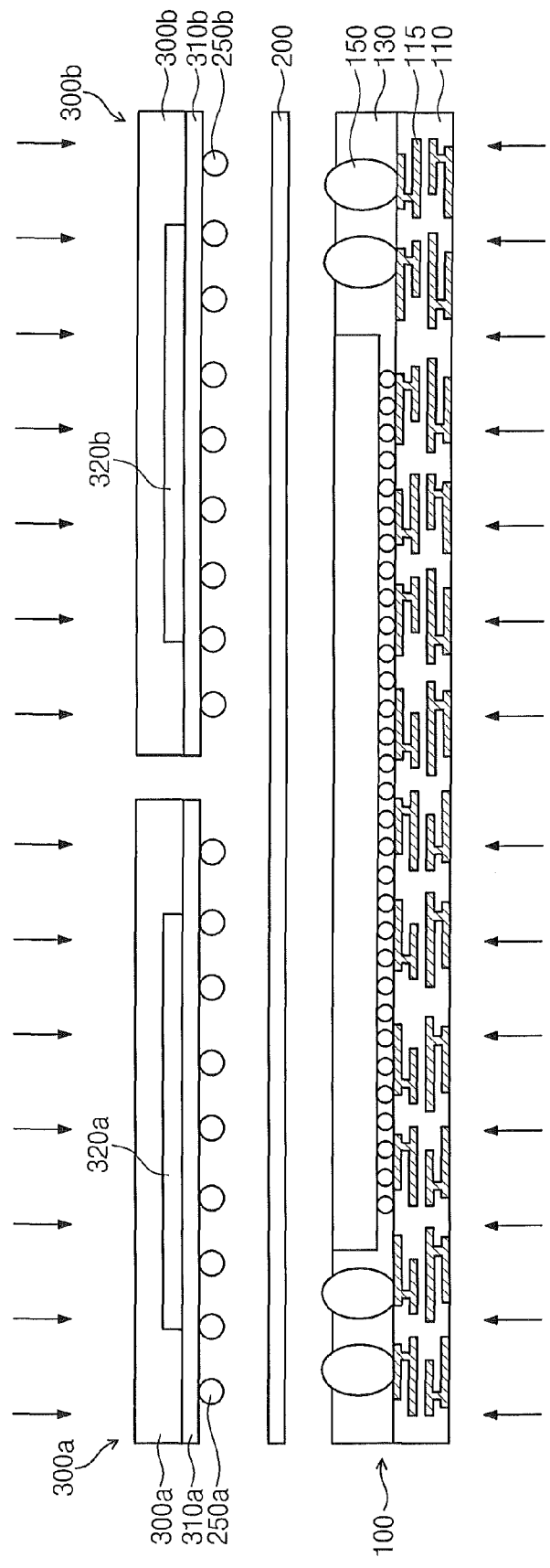

FIG. 2 is a flowchart illustrating a method of manufacturing a semiconductor device according to some embodiments of the inventive concept, and FIGS. 3A through 3C are cross-sectional views illustrating a method of manufacturing a semiconductor device according to some embodiments of the inventive concept.

Referring to FIGS. 2 and 3A, a first semiconductor package 100 may be manufactured (S1000). For example, a first semiconductor chip 120 may be mounted on a first substrate 110, and then a first mold part 130 may be formed on the first substrate 110. Thus, the first semiconductor package 100 may be manufactured.

After the first semiconductor package 100 is manufactured, electrical characteristics of the first semiconductor package 100 may be tested (S1100). If the electrical characteristics of the first semiconductor package 100 are excellent and then pass the test S1100, the first semiconductor package 100 is complete. If the electrical characteristics of the first semiconductor package 100 are poor, the first semiconductor package 100 may be remanufactured.

Next, the first mold part 130 may be partially etched to form first connecting patterns 210 electrically connected to the first substrate 110. In the present embodiment, the first connecting patterns 210 may be solder balls.

Referring to FIGS. 2 and 3B, second semiconductor packages 300a and 300b may be manufactured (S1300). Second semiconductor chips 320a and 320b may be mounted on second substrates 310a and 310b, respectively, and then second mold parts 330a and 330b may be formed on the second substrates 310a and 310b, respectively. Thus, the second semiconductor packages 300a and 300b may be manufactured (S1300).

After the second semiconductor packages 300a and 300b are manufactured, electrical characteristics of the second semiconductor packages 300a and 300b may be tested (S1300). If the electrical characteristics of the second semiconductor packages 300a and 300b are excellent and then pass the test S1300, the second semiconductor packages 300a and 300b are complete. If the electrical characteristics of the second semiconductor packages 300a and 300b are poor, the second semiconductor packages 300a and 300b may be remanufactured.

Subsequently, second connecting patterns 220 may be formed on a bottom surface of each of the second substrates 310a and 310b.

Referring to FIGS. 2 and 3C, the first semiconductor package 100 is bonded to a bottom surface of an interposer 200 (S1400), and the second semiconductor packages 300a and 300b are bonded to a top surface of the interposer 200 (S1500). For example, the first connecting patterns 210 come in contact with the bottom surface of the interposer 200, and the second connecting patterns 220 come in contact with the top surface of the interposer 200. Heat may be applied to the structure including the first connecting patterns 210 contacting the bottom surface of the interposer 200 and the second connecting patterns 210 contacting the top surface of the interposer 200. As a result, the first semiconductor package 100 and the second semiconductor package 300a and 300b may be bonded to the bottom surface and the top surface of the interposer 200.

According to the embodiments illustrated in FIGS. 1A and 1C, a size of the interposer 200 may be substantially equal to a size of the first semiconductor package 100. According to the embodiment illustrated in FIG. 1B, a size of the interposer 200 may be greater than a size of the first semiconductor package 100.

Figure 4A:
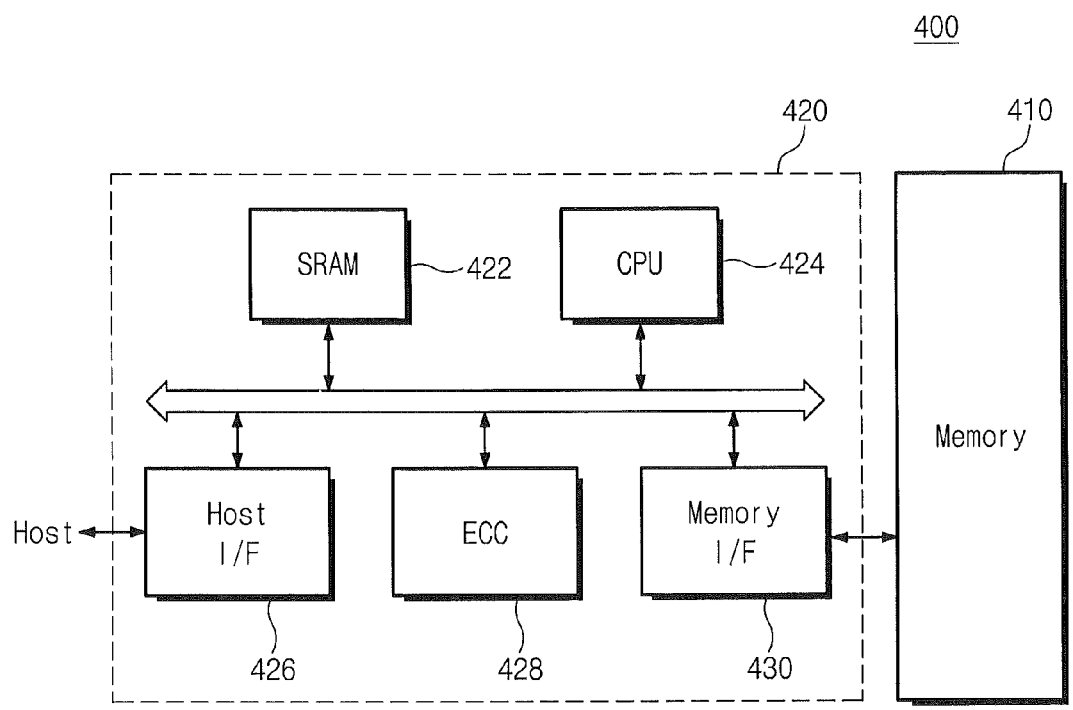
FIG. 4A is a schematic block diagram illustrating a memory card including a semiconductor device according to some embodiments of the inventive concept.

FIG. 4A is a schematic block diagram illustrating a memory card including a semiconductor device according to some embodiments of the inventive concept.

Referring to FIG. 4A, the semiconductor device according to the aforementioned embodiments may be applied to a memory card 400. For example, the memory card 400 may include a memory controller 420 that controls data communication between a host and a memory device 410. A static random access memory (SRAM) device 422 may be used as an operation memory of a central processing unit (CPU) 424. A host interface unit 426 may be configured to include a data communication protocol between the memory card 400 and the host. An error check and correction (ECC) block 428 may detect and correct errors of data which are read out from the memory device 410. A memory interface unit 430 may interface with the memory device 410. The CPU 424 controls overall operations of the memory controller 424.

When the memory device 410 in the memory card 400 may include the semiconductor device according to the aforementioned embodiments of the inventive concept, the warpage phenomenon of the semiconductor device may be suppressed by the interposer, and the degree of freedom of the size of the semiconductor package in the semiconductor device may increase. Additionally, the electrical error of the semiconductor device may be reduced maintaining the density of the memory chips. Furthermore, the pinouts may be unified and simplified by the interposer.

Figure 4B:
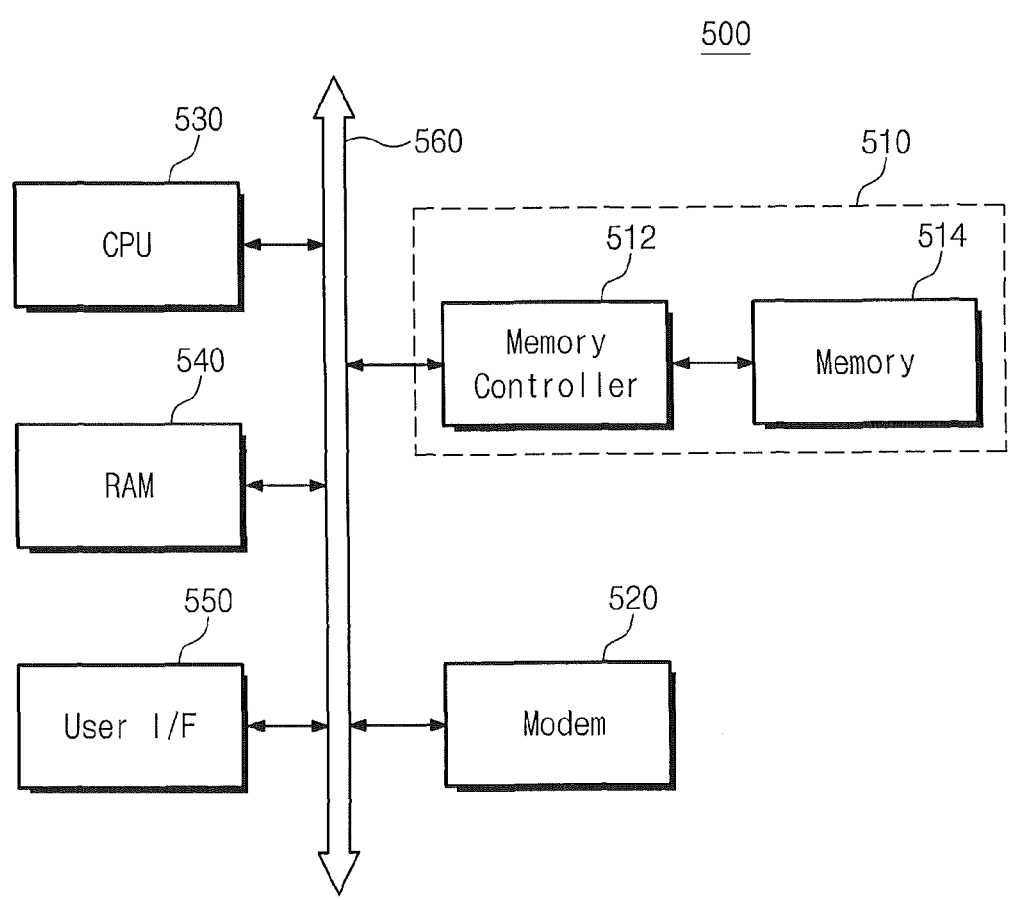
FIG. 4B is a schematic block diagram illustrating a system including a semiconductor device according to some embodiments of the inventive concept.

FIG. 4B is schematic block diagram illustrating a system including a semiconductor device according to embodiments of the inventive concept.

Referring to FIG. 4B, an information processing system 500 may include the semiconductor device according to the embodiments described above. The information processing system 500 may include a mobile device or a computer. For example, the information processing system 500 may include a modem 520, a central processing unit (CPU) 530, a random access memory (RAM) 540, and a user interface unit 550 that are electrically connected to a memory system 510 through a system bus 560. The memory system 510 may store data processed by the CPU 530 or data inputted from an external system. The memory system 510 may include a memory device 512 and a memory controller 514. The memory system 510 may have substantially the same structure as the memory card 400 described with reference to FIG. 4A. The information processing system 500 may be realized as a memory card, a solid state disk (SSD) device, a camera image sensor and another type of application chipset. For example, the memory system 510 may consist of the SSD device. In this case, the information processing system 500 may stably and reliably store massive data.

According to embodiments of the inventive concept, the interposer is disposed between the first semiconductor package and the second semiconductor packages, such that the warpage phenomenon of the semiconductor device may be reduced or prevented. Additionally, the degree of freedom of the size of the semiconductor packages may increase, such that the electrical error of the semiconductor device may be reduced maintaining the density of the memory chips. Moreover, the pinouts may be unified and simplified by the interposer.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
an interposer;
a first semiconductor package electrically connected to a bottom surface of the interposer comprising:
a first substrate; and
a first semiconductor chip mounted on the first substrate; and
at least two second semiconductor packages electrically connected to a top surface of the interposer, the at least two second semiconductor packages spaced apart from each other in a direction parallel to the top surface of the interposer, wherein each of the second semiconductor packages comprises:
a second substrate;
a second semiconductor chip mounted on the second substrate; and
a mold part disposed on the second substrate to protect the second semiconductor chip, wherein the interposer is spaced apart from the first substrate to define a first gap therebetween and wherein the interposer is spaced apart from the second substrate to define a second gap therebetween.

2. The semiconductor device of claim 1, wherein a width of the interposer is substantially equal to or greater than a width of the first semiconductor package.

3. The semiconductor device of claim 1, wherein a width of each of the second semiconductor packages is smaller than a width of the interposer and is smaller than a width of the first semiconductor package.

4. The semiconductor device of claim 1, further comprising:
first connecting patterns disposed on the first substrate and adjacent to the first semiconductor chip,
wherein the first connecting patterns electrically connect the first substrate to the interposer.

5. The semiconductor device of claim 4, further comprising:
second connecting patterns disposed between the second substrate and the interposer,
wherein the second connecting patterns electrically connect the interposer to the second substrate.

6. The semiconductor device of claim 4, wherein the first semiconductor chip includes a logic chip; and
wherein the second semiconductor chip includes a memory chip.

7. A semiconductor device comprising:
an interposer;
a first semiconductor chip mounted on a first substrate with a first connecting pattern, wherein the first semiconductor chip is electrically connected to a bottom surface of the interposer through a second connecting pattern disposed on the first substrate and adjacent to the first semiconductor chip;
a first mold part covering the first substrate and the first connecting pattern, wherein the first mold part surrounds the first semiconductor chip and the second connecting pattern, exposing a top surface of the first semiconductor chip; and
at least two semiconductor packages directly connected to a top surface of the interposer with third connecting patterns, wherein each of the at least two semiconductor packages comprises a second semiconductor chip protected by a second mold part, and wherein the at least two semiconductor packages are laterally adjacent to each other along the interposer.

8. The semiconductor device of claim 7, wherein the first semiconductor chip comprises a logic chip, and wherein the second semiconductor chips comprise memory chips.

9. The semiconductor device of claim 7, wherein the first mold part comprises an exposed-mold underfill structure.

10. The semiconductor device of claim 7, wherein the second mold parts cover the second semiconductor chips.

11. The semiconductor device of claim 7, wherein the second mold parts comprise exposed-mold underfill structures.

12. The semiconductor device of claim 7, wherein the second semiconductor chips are mounted on second substrates that are directly connected to the third connecting patterns and covered by the second mold parts.

13. The semiconductor device of claim 7, wherein the second semiconductor packages comprise through-electrodes covered by the second mold parts.

14. The semiconductor device of claim 7, wherein the second and third connecting patterns comprise solder balls.

15. The semiconductor device of claim 7, wherein the top surface of the interposer comprises pinouts arranged to couple to at least two semiconductor packages having different widths.

16. The device of claim 7 wherein the interposer and the first substrate are spaced apart from one another to define a gap therebetween.

17. is amended as follows:
A semiconductor device comprising:
an interposer;
a first semiconductor package having an upper surface, the upper surface being electrically connected to a lower surface of the interposer, the first semiconductor package containing a first substrate and a first semiconductor chip mounted on the first substrate;
first connecting patterns on the upper surface of the first semiconductor package, the first connecting patterns electrically connecting the interposer to a lower surface of the first semiconductor chip through the first substrate; and a second semiconductor package, opposite the first semiconductor package, the second semiconductor package including a second substrate comprising a circuit board and including a second semiconductor chip comprising a logic circuit or memory circuit, the second semiconductor package electrically connected to, and spaced apart from, an upper surface of the interposer.

18. The device of claim 17 wherein the interposer and the first substrate are spaced apart from one another to define a gap therebetween.

\* \* \* \* \*